(12) United States Patent
Alayavalli et al.

(10) Patent No.: US 12,068,153 B2
(45) Date of Patent: Aug. 20, 2024

(54) SITU CLEAN FOR BEVEL AND EDGE RING

(71) Applicant: Applied Materials, Inc., Santa Clara, CA (US)

(72) Inventors: Kaushik Alayavalli, Sunnyvale, CA (US); Andrew Nguyen, San Jose, CA (US); Edward Haywood, Santa Clara, CA (US); Lu Liu, San Jose, CA (US); Malav Kapadia, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/829,288

(22) Filed: May 31, 2022

(65) Prior Publication Data
US 2023/0386823 A1 Nov. 30, 2023

(51) Int. Cl.
*H01J 21/02* (2006.01)
*H01J 37/32* (2006.01)
*H01L 21/02* (2006.01)

(52) U.S. Cl.
CPC .... *H01L 21/02087* (2013.01); *H01J 37/3244* (2013.01); *H01J 2237/335* (2013.01)

(58) Field of Classification Search
CPC .......... H01L 21/02087; H01J 37/3244
See application file for complete search history.

(56) References Cited

U.S. PATENT DOCUMENTS

| | | | |
|---|---|---|---|
| 2019/0341275 A1* | 11/2019 | Jin | B08B 7/0035 |
| 2021/0035844 A1 | 2/2021 | Cho et al. | |
| 2021/0142983 A1* | 5/2021 | Ikeda | H01J 37/16 |
| 2021/0272782 A1* | 9/2021 | Koshimizu | H01J 37/32642 |
| 2021/0296098 A1 | 9/2021 | Cho et al. | |
| 2022/0115218 A1* | 4/2022 | Nagayama | H01L 21/68735 |
| 2022/0399193 A1* | 12/2022 | Cui | H01J 37/32128 |

FOREIGN PATENT DOCUMENTS

WO WO-2021262529 A1 * 12/2021

\* cited by examiner

*Primary Examiner* — Sharidan Carrillo
(74) *Attorney, Agent, or Firm* — Patterson + Sheridan, LLP

(57) ABSTRACT

Embodiments disclosed herein include a method for cleaning a bevel area of a substrate support disposed within a plasma processing chamber. In one example the method begins by placing a cover substrate on a substrate support disposed in an interior volume of a processing chamber. A cleaning gas is provided into the interior volume of the processing chamber. A plasma is struck in the interior volume of the processing chamber. A cleaning gas is provided through the substrate support to a bevel edge area defined between an outer diameter of the cover substrate and an edge ring disposed on the substrate support.

8 Claims, 4 Drawing Sheets

SITU CLEAN FOR BEVEL AND EDGE RING

BACKGROUND

Field

Embodiments of the present invention generally relate to substrate supports used in processing chambers for fabricating microelectronic devices.

Description of the Related Art

In the fabrication of integrated circuits, deposition processes such as chemical vapor deposition (CVD) or plasma enhanced CVD processes are used to deposit films of various materials upon semiconductor substrates. During a CVD process, chemical reactions used for depositing a desired material take place in an enclosed process chamber. When the material is deposited on the substrate, residue comprising this material, as well as by-products of the CVD process, accumulates on the internal walls and other components of the process chamber. The residue builds up, as more substrates are processed in the chamber, and leads to generation of particles and other contaminants and, as such, to degradation of the deposited films. Consequently, it is recommended to clean the interior of the CVD chamber on a regular basis.

A process kit may be disposed in the chamber to help bound a processing volume to a desired region above the substrate in conjunction with a purge gas provided from a bottom of the chamber. The process kit typically includes one or more rings and liners. The rings may be configured to assist in confining the plasma to the processing region. However, during processing the rings may become contaminated with particles and deposited films. The build-up of material from the deposited films on the rings increases the potential for substrate contamination during processing and may adversely affect process uniformity. To mitigate particle buildup and contamination on the rings, the processing chamber may undergo a cleaning cycle to remove deposited material from the rings and liners. To protect the substrate support during a clean operation, a dummy substrate may be placed on the substrate support. However, the cleaning gases are unable to reliably remove the contamination at the edge of the substrate support between the dummy substrate and the ring. The particle accumulation increases over time and results in defects and chamber preventive maintenance procedures.

Conventional cleaning processes often use a '2' steps (a remote plasma portion and a bias portion). Both of these steps are unable to address the residue accumulation in the above mentioned areas and in particular a bevel area of the ring.

Therefore, there is a need for an improved apparatus and method for cleaning the substrate support prior to processing a substrate.

SUMMARY

Embodiments disclosed herein include a method for cleaning a bevel area of a substrate support disposed within a plasma processing chamber. The method begins by placing a cover substrate on a substrate support disposed in an interior volume of a processing chamber. A cleaning gas is provided into the interior volume of the processing chamber. A plasma is struck in the interior volume of the processing chamber. Cleaning gas is provided through the substrate support to a bevel edge area between an outer diameter of the cover substrate and an edge ring disposed on the substrate support.

BRIEF DESCRIPTION OF THE DRAWINGS

So that the manner in which the above recited features of embodiments of the present invention can be understood in detail, a more particular description of embodiments of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for embodiments of the invention may admit to other equally effective embodiments.

Additional features and advantages will be set forth in the detailed description which follows, and in part will be readily apparent to those skilled in the art from that description or recognized by practicing the embodiments as described herein, including the detailed description which follows, the claims, as well as the appended drawings.

It is to be understood that both the foregoing general description and the following detailed description are merely exemplary, and are intended to provide an overview or framework to understanding the nature and character of the claims. The accompanying drawings and included to provide a further understanding, and are incorporated in and constitute a part of this specification. The drawings illustrate one or more embodiment(s), and together with the description serve to explain principles and operation of the various embodiments.

DETAILED DESCRIPTION

Reference will now be made in detail to the embodiments, examples of which are illustrated in the accompanying drawings, in which some, but not all embodiments are shown. Indeed, the concepts may be embodied in many different forms and should not be construed as limiting herein; rather, these embodiments are provided so that this disclosure will satisfy applicable legal requirements. Whenever possible, like reference numbers will be used to refer to like components or parts.

The method disclosed herein enables the delivery of a cleaning gas directly to hard to clean areas by directing the flow from under the substrate out to a bevel area adjacent the substrate and edge ring. Alternately, the cleaning gas is directed to the bevel area through the edge ring or between the edge ring and the substrate support. Typically, backside gas flowing under the substrate is limited to inert gases for heat transfer. The method disclosed herein allows the backside gas near the edge of the substrate to be switched from the inert gas, such as helium (He), to an active cleaning gas, such as oxygen ($O_2$), among other cleaning gases.

The cleaning improvements described herein provides a cleaning gas supply through the substrate support which is guided to the edge/bevel area of the cover substrate (cleaning substrate) by means of channels cut specifically for the purpose of uniform distribution in the cover substrate. The channels may be machined on to a cover substrate that will serve as a protective covering for the substrate support surface during the clean cycle. The substrate support, or electrostatic chuck (ESC), outer backside gas sealing band may be modified to supply a steady leak rate of the cleaning gas for cleaning the bevel area at the ring assembly.

Figure 1:
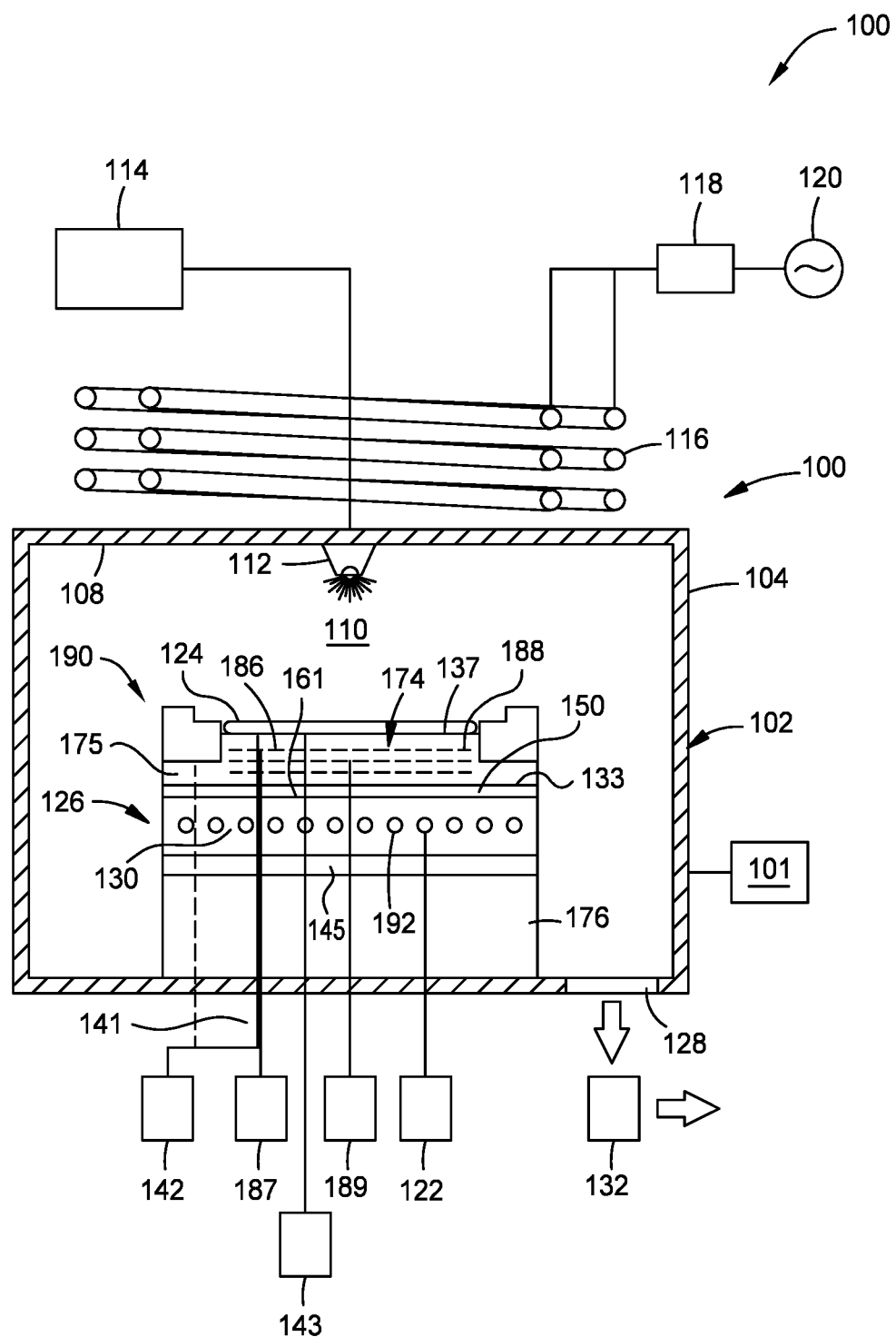
FIG. 1 is a schematic side view of an exemplary plasma processing chamber.

FIG. 1 is a cross-sectional schematic view of an exemplary processing chamber 100, shown configured as a deposition chamber, having a substrate support assembly 126. The substrate support assembly 126 may be utilized in plasma treatment chambers, annealing chambers, physical vapor deposition (PVD) chambers, chemical vapor deposition (CVD) chambers, and ion implantation chambers, etch chambers, among others, as well as other systems where the ability to control processing uniformity for a surface or substrate, such as a substrate 124, is desirable.

The processing chamber 100 includes a chamber body 102 having sidewalls 104, a bottom and a lid 108 that enclose an interior processing region 110. An injection apparatus 112 is coupled to the sidewalls 104 and/or lid 108 of the chamber body 102. A gas panel 114 is coupled to the injection apparatus 112 to allow processing gases to be provided into the interior processing region 110. The injection apparatus 112 may be one or more nozzle or inlet ports, or alternatively a showerhead. The injection apparatus 112 may additionally supply a cleaning gas during cleaning operations.

Processing gas, along with processing by-products, are removed from the interior processing region 110 through an exhaust port 128 formed in the sidewalls 104 or bottom 106 of the chamber body 102. The exhaust port 128 is coupled to a pumping system 132, which includes throttle valves and pumps utilized to control the vacuum levels within the interior processing region 110.

The processing gas may be energized to form a plasma within the interior processing region 110. The processing gas may be energized by capacitively or inductively coupling RF power to the processing gases. In the embodiment depicted in FIG. 1, a plurality of coils 116 are disposed above the lid 108 of the processing chamber 100 and are coupled through a matching circuit 118 to an RF power source 120. Power applied to the plurality of coils 116 inductively coupled power to the processing gas to form a plasma within the interior processing region 110.

The substrate support assembly 126 is disposed in the interior processing region 110 below the injection apparatus 112. The substrate support assembly 126 includes an electrostatic chuck (ESC) 174 and a cooling plate 130. A base plate 176 supports the cooling plate 130. One of the sidewalls 104 or bottom 106 of the processing chamber 100 supports the base plate 176. The substrate support assembly 126 may additionally include a heater assembly (not shown). Additionally, the substrate support assembly 126 may include a facility plate 145 and/or an insulator plate (not shown) disposed between the cooling plate 130 and the base plate 176 to facilitate electrical, cooling, and gas connections with the substrate support assembly 126.

The cooling plate 130 includes a plurality of cooling channels 192 formed therein. The cooling channels 192 are connected to a heat transfer fluid source 122. The heat transfer fluid source 122 provides a heat transfer fluid, such as a liquid, gas or combination thereof, which is circulated through one or more cooling channels 192 disposed in the cooling plate 130. The fluid flowing through neighboring cooling channels 192 may be isolated to enabling local control of the heat transfer between the ESC 174 and different regions of the cooling plate 130, which assists in controlling the lateral temperature profile of the substrate 124.

A bonding layer 150 is disposed below the ESC 174 and secures the ESC 174 to the cooling plate 130. In other embodiments, the bonding layer 150 is disposed between the ESC 174 and a lower plate that is disposed between the ESC 174 and cooling plate 130, as will be described further below. The bonding layer 150 may be formed from several layers. The layers containing the bonding layer 150 may be formed from different materials and is discussed in reference to subsequent figures illustrating separate embodiments.

The ESC 174 has a dielectric body 175. The dielectric body 175 has a substrate support surface 137 and a bottom surface 133 opposite the substrate support surface 137. The dielectric body 175 of the ESC 174 is fabricated from a ceramic material, such as alumina ($Al_2O_3$), aluminum nitride (AlN) or other suitable material. Alternately, the dielectric body 175 may be fabricated from a polymer, such as polyimide, polyetheretherketone, polyaryletherketone and the like.

The ESC 174 generally includes a chucking electrode 186 embedded in the dielectric body 175. The chucking electrode 186 may be configured as a mono polar or bipolar electrode, or other suitable arrangement. The chucking electrode 186 is coupled through an RF filter to a chucking power source 187, which provides a DC power to electrostatically secure the substrate 124 to the substrate support surface 137 of the ESC 174. The RF filter prevents RF power utilized to form a plasma (not shown) within the processing chamber 100 from damaging electrical equipment or presenting an electrical hazard outside the chamber.

The substrate support surface 137 of the ESC 174 includes gas passages 141 in communication with a first and second backside gas supplies 143/142 for providing backside heat transfer gas to the interstitial space defined between the substrate 124 and the substrate support surface 137 of the ESC 174. The first and second backside gas supplies 143/142 may provide an inert cooling gas such as helium, argon, nitrogen or other suitable gas. The second backside gas supply 142 may additionally supply a cleaning gas such as chlorine, fluorine, oxygen or other suitable gas.

The ESC 174 also includes lift pin holes for accommodating lift pins (See 252 in FIG. 2) for elevating the substrate 124 above the substrate support surface 137 of the ESC 174 to facilitate robotic transfer into and out of the processing chamber 100. The lift pin holes 252 may be fluidly coupled to a pump for removing the gas supplied by the first backside gas supply 143.

The dielectric body 175 optionally includes one or more primary resistive heaters 188 embedded therein. The primary resistive heaters 188 are utilized to elevate the temperature of the substrate support assembly 126 to a temperature suitable for processing a substrate 124 disposed on the substrate support surface 137 of the substrate support assembly 126. The primary resistive heaters 188 are coupled through the facility plate 145 to a heater power source 189. A controller 101 is utilized control the operation of the heater power source 189, which is generally set to heat the substrate 124 to a predefined temperature. In one or more embodiments, the primary resistive heaters 188 include a plurality of laterally separated heating zones, wherein the controller enables at least one zone of the primary resistive heaters 188 to be preferentially heated relative to the primary resistive heaters 188 located in one or more of the other zones. For example, the primary resistive heaters 188 may be arranged concentrically in a plurality of separated heating zones.

The controller 101 includes a processor, a memory, and support circuits that are coupled to one another. The controller 101 is electrically coupled to the processing chamber 100 and is configured to perform chamber operations for running recipes for deposition and cleaning among other chamber operations. For example, the controller 101 may direct the release of the cleaning gas through the substrate support assembly 126 during a cleaning operation.

The processor may be one of any form of general purpose microprocessor, or a general purpose central processing unit (CPU), each of which can be used in an industrial setting, such as a programmable logic controller (PLC), supervisory control and data acquisition (SCADA) systems, or other suitable industrial controller. The memory is non-transitory and may be one or more of readily available memory such as random access memory (RAM), read only memory (ROM), or any other form of digital storage, local or remote. The memory contains instructions, that when executed by the processor, facilitates execution of a method 500 for cleaning residual particles from a processing chamber, as further described below with reference to FIG. 5. The instructions in the memory are in the form of a program product such as a program that implements the method of the present disclosure. The program code of the program product may conform to any one of a number of different programming languages. Illustrative computer-readable storage media include, but are not limited to: (i) non-writable storage media (e.g., read-only memory devices within a computer such as CD-ROM disks readable by a CD-ROM drive, flash memory, ROM chips, or any type of solid-state non-volatile semiconductor memory) on which information is permanently stored; and (ii) writable storage media (e.g., floppy disks within a diskette drive or hard-disk drive or any type of solid-state random-access semiconductor memory) on which alterable information is stored. Such computer-readable storage media, when carrying computer-readable instructions that direct the functions of the methods described herein, are examples of the present disclosure.

Figure 2:
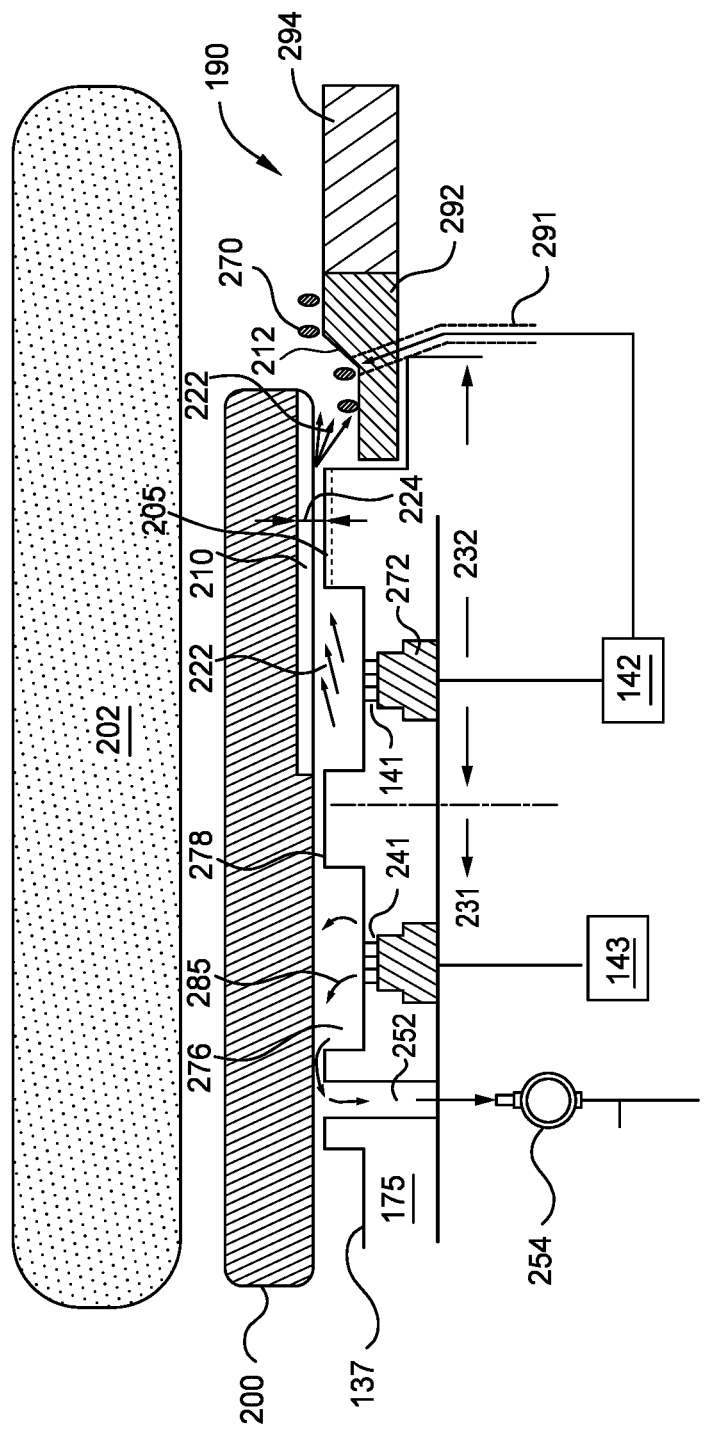
FIG. 2 illustrate a portion of the substrate support assembly and ring assembly suitable for use in the plasma processing chamber of FIG. 1.

Continuing to refer to FIG. 1, a ring assembly 190 is positioned about an outer portion 222 of the substrate support surface 137 of the ESC 174. The ring assembly 190 is configured to circumscribe the outer periphery of the substrate 105. FIG. 2 illustrates a portion of the ESC 174 and ring assembly 190 suitable for use in the plasma processing chamber of FIG. 1.

The ESC 174 has an edge portion 232 and an inner portion 231. Although the edge portion 232 is depicted to encompass only a small outer area of the ESC 174, it should be appreciated that the edge portion 232 is sized such that it has at least an outer ring 272 of gas passages 141 which are coupled to the backside gas supply 142.

Mesas 278 and recess 276 are disposed on the substrate support surface 137 of the ESC 174. The substrate support surface 137 may additionally contain one or more of grooves, channels and/or other surface features. The substrate 124 is supported on the mesas 278 and elevated above the recesses 276. The recess 276 may be in fluid communication with the backside gas supplies 142/143 to provide a fluid, such as helium, argon or other suitable backside gas, between the mesas 278. The backside gas may be delivered from the gas supply 143 to the recess 276 through one or more backside gas delivery holes 241 formed in the ESC 174. The backside gas may flow between the substrate 124 and the ESC 174 in order to help regulate the rate of heat transfer between the ESC 174 and the substrate 124. In one example, the backside gas may comprise an inert gas, such as argon. The gas supply may deliver about 4 or more Torr, such as 10 Torr, of backside gas pressure. One or more lift pin holes 252 may be coupled to a vacuum 254 for removing the backside gas through the lift pin holes 252.

The ring assembly 190 may include an edge ring 292 and an outer ring 294. The edge ring 292 is disposed on the edge portion 232 of the ESC 174. The substrate 124 disposed on the mesas 278 extends at least partially above a portion of the edge ring 292. A bevel area 212 is at least partially bounded by the substrate 124, the ESC 174 and the edge ring 292. Optionally, a plurality of gas ports 291 may extend through the edge ring 292. The gas ports 291 are fluidly coupled to the backside gas supply 142. In one example, the edge ring 292 has gas ports 291. In another example, the edge ring 292 does not have gas ports. In examples where the edge ring 292 has gas ports 291, the gas ports 291 are arranged to provide a cleaning gas to the bevel area 212.

After deposition of the material layer on the substrate 124, a cleaning operation may be performed to remove particles from within the processing chamber 100 to reduce particle contamination and/or substrate defects during subsequent substrate deposition operations. For example, particles 270 may accumulate in the bevel area 212 during deposition on the substrate 124 which can beneficially be removed by a cleaning operation to increase product yield when processing subsequent substrates.

Once processing of the substrate 124 is complete, a cover substrate 200 is disposed on the ESC 174, and a plasma 202 struck from a cleaning gas provided into the processing chamber 100. The cover substrate 200 may be fabricated from a ceramic material, such as alumina ($Al_2O_3$) or aluminum nitride (AlN), or other suitable material. The cover substrate 200 may have a groove 210 along the outer edge of the cover substrate 200 that extends across the edge portion 232 of the ESC 174.

The cover substrate 200 will briefly be discussed with respect to FIGS. 3A through 4B. The cover substrate 200 has a top surface 320, a bottom surface 310, and an outer perimeter 330. The cover substrate 200 is shown with an 'X' axis 392 in a 'Y' axis 391 extending through a center of the cover substrate 200.

The groove 210 is formed in the bottom surface 310 of the cover substrate 200. The groove 210 may have a depth defined between a bottom of the groove 210 and the bottom surface 310. The depth of the groove 210 may be between about 0.001 inches and about 0.010 inches, such as about 0.005 inches. The groove 210 extends through the outer perimeter 330. In one example, the grooves extent along the outer third of a diameter of the cover substrate 200. In another example, the grooves 210 extend along the outer quarter of the diameter of the cover substrate 200.

Figure 3A:
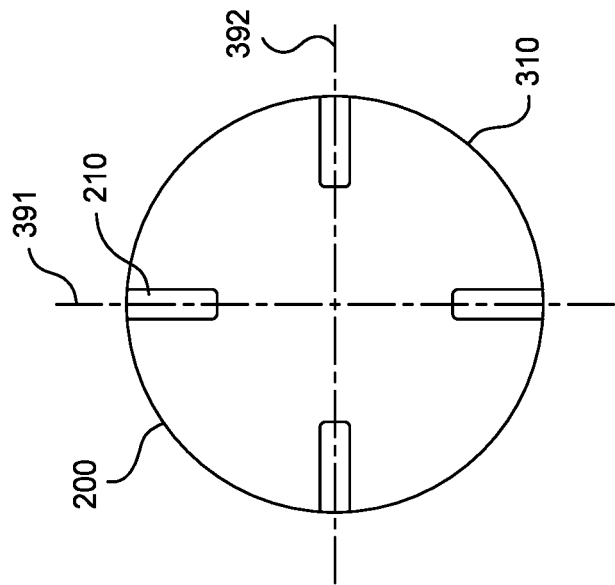
Figure 3B:
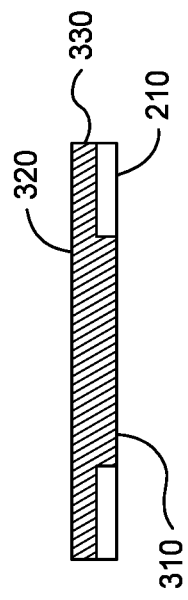

The groove 210 may be radially aligned with the center of the cover substrate 200. For example, the groove 210 may be orthogonal with the outer perimeter 330. Although the examples shown in FIG. 3A and FIG. 4A illustrate four grooves 210, it should be appreciated that the number of grooves 210 are such that cleaning gases passing through the grooves 210 are uniformly distributed along the outer perimeter 330 of the cover substrate 200.

Figure 4A:
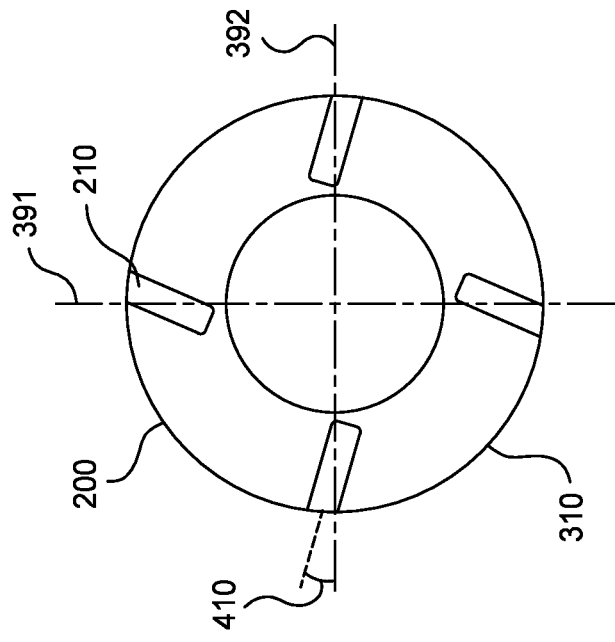
FIGS. 3A-4B illustrate a cover substrate for performing a cleaning recipe.
Figure 4B:
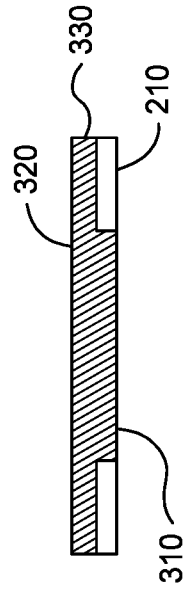

FIG. 4A illustrates a second example of the grooves 210. The grooves 210 may be disposed at an angle 410 from the radial alignment with the center of the cover substrate 200. The angle 410 may be between about 0° and about 45°. In yet in other examples, the grooves 210 may be curved. The grooves 210 may have a C shape, S shape, or other curved shape such that the cleaning gas is directed to concentrate in the bevel area 212 defined between the edge ring 292 and the cover substrate 200.

In another example, a plurality of grooves 205 can be implemented on an outer band of ESC 174. For example, the ESC 174 may have grooves 205 formed into the outer band for venting cleaning gas from the backside gas holes out to the bevel area 212 when a substrate forms a seal with the outer band. The outer backside gas holes may be configured to supply either inert backside gas or cleaning gas. During plasma processing of a substrate, such as a layer deposition operation, the outer gas holes may provide an inert gas or no gas at all. During a cleaning operation, the outside gas holes may be used to direct the cleaning gas to the bevel area 212. It should be appreciated that the outer ring of backside gas holes may provide a different type of gas species, such as a cleaning gas, from the remaining backside gas holes, supplying an inert gas, depending on process needs.

Figure 5:
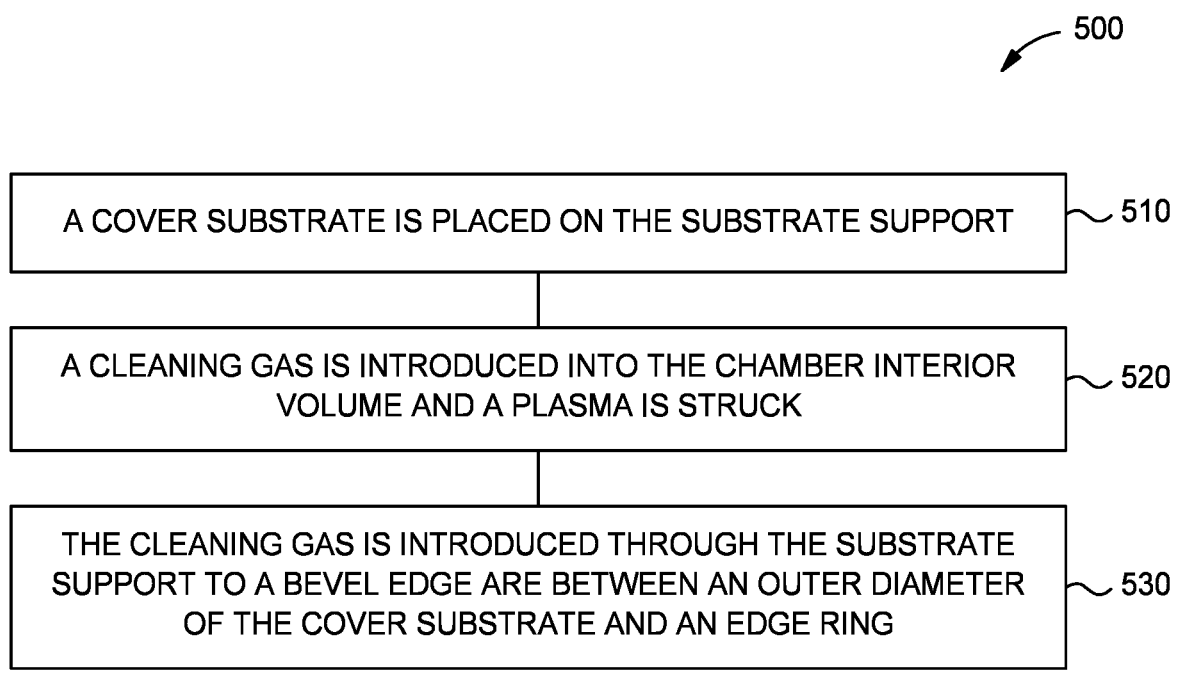
FIG. 5 is a flow diagram of a method for cleaning residual particles from a processing chamber.

FIG. 5 is a flow diagram of a method 500 for cleaning residual particles from the processing chamber 100 or other suitable processing chamber. After processing the substrate 124 in the processing chamber 100, the substrate 124 is removed from the processing chamber 100 and the chamber 100 is prepared for processing the next production substrate. During the preparation of the processing chamber 100, particles are removed from the chamber environment and surfaces in a cleaning operation to prevent the particles from contaminating the next substrate to be processed within the chamber 100.

At operation 510 of the method 500, a cover substrate 200 is placed on the substrate support. The cover substrate prevents cleaning gas from reacting with the substrate support and while leaving those areas adversely affected by the deposition of materials and the processing chamber exposed for cleaning. The cover substrate may have grooves on the bottom surface along the outer perimeter. The grooves on the bottom surface permit gas introduced under the cover substrate to exit along an outer perimeter of the substrate in the bevel area.

At operation 520, a cleaning gas is introduced into the chamber interior processing region 110 and a plasma is struck from the cleaning gas. The cleaning gas may be fluorine, chlorine, oxygen or other suitable gas reactive with materials built up in the chamber during the deposition processes. The cleaning gas reacts with the particles disposed on exposed surfaces within the processing chamber, and are pumped out of the chamber with the vacuum pump during the cleaning process.

At operation 530, the cleaning gas is additionally introduced through the substrate support to a bevel edge area defined between an outer diameter of the cover substrate and an edge ring. The introduction of the cleaning gas at the bevel edge allows for particles in the bevel edge area to be removed by the cleaning gas which otherwise would be left unaffected by cleaning gas introduced solely from outside the substrate support as down in conventional processes.

The substrate support may have backside gas holes separated into an inner zone and an outer zone. An inert backside gas may be introduced in the inner zone. A vacuum may draw the inert backside gas through lift pins holes or other holes in the substrate support to limit amount of backside gas within the inner zone. The cleaning gas is introduced in the outer zone. The backside gas in the inner zone creates a buffer separating the cleaning gas from the outer zone, preventing the cleaning gas from the outer zone from entering the inner zone. The cleaning gas escapes the outer zone through two channels formed in the cover substrate and flows into the area below the substrate edge and the edge ring. In this manner, the cleaning gas is introduced through the substrate support from the outer zone to the bevel area.

Alternately, or in conjunction with the cleaning gas introduced through the backside gas holes in the outer zone of the substrate support, the cleaning gas may be introduced through a conduit or hole disposed in the edge ring. The cleaning gas is directly channeled through the substrate support and the edge ring disposed thereon into the bevel area.

In yet another alternative, the cleaning gas is introduced in an area between the rings assembly and the body of the ESC. Gas conduits may extend through the substrate support to a channel or area which vents into the bevel area.

Advantageously, the method and apparatus disclosed above enables cleaning of hard to clean areas such as the bevel area on a substrate support assembly. The reduced cleaning time results in significant improvements in throughput. The lower clean times mean less damage to the process kit extending mean time between cleaning and refurbishment/preventative maintenance costs.

Many modifications and other embodiments not set forth herein will come to mind to one skilled in the art to which the embodiments pertain having the benefit of the teachings presented in the foregoing descriptions and the associated drawings. Therefore, it is to be understood that the description and claims are not to be limited to the specific embodiments disclosed and that modifications and other embodiments are intended to be included within the scope of the appended claims. It is intended that the embodiments cover the modifications and variations of the embodiments provided they come within the scope of the appended claims and their equivalents. Although specific terms are employed herein, they are used in a generic and descriptive sense only and not for purposes of limitation.

While the foregoing is directed to embodiments of the present invention, other and further embodiments of the invention may be devised without departing from the basic scope thereof, and the scope thereof is determined by the claims that follow.

What is claimed is:

1. A method for cleaning a substrate support, the method comprising:
    placing a cover substrate on a substrate support disposed in an interior volume of a processing chamber, the substrate support having a plurality of gas holes disposed through a dielectric body of the substrate support;
    providing a first cleaning gas from a first gas source into the interior volume of the processing chamber;
    striking a plasma in the interior volume of the processing chamber;
    providing a second cleaning gas from a first backside gas supply through an outer ring of a first set of gas holes of the plurality of gas holes disposed in an edge portion of the substrate support to a substrate support bevel edge area defined between an outer diameter of the cover substrate and an edge ring disposed on the substrate support while providing an inert gas from a second backside gas supply through a second set of gas holes of the plurality of gas holes disposed in an inner portion of the substrate support, wherein the inner portion is circumscribed by the outer edge portion, and wherein the inert gas in the inner portion creates a buffer to prevent the second cleaning gas from the edge portion from entering the inner portion; and
    cleaning the substrate support bevel edge area.

2. The method of claim 1, further comprising:
removing the inert gas by vacuum through a hole in the inner portion of the substrate support.

3. The method of claim 1, wherein the cover substrate has grooves along a bottom of the cover substrate extending through an outer periphery of the cover substrate.

4. The method of claim 1, further comprising:
providing the second cleaning gas through a hole in the edge ring into the bevel edge.

5. The method of claim 3 wherein the grooves are about 0.001 inches to about 0.010 inches deep and extend only along an outer third of an outer diameter of the cover substrate.

6. A non-transitory computer readable storage medium comprising a program product which, when executed, is configured to perform an operation cleaning a bevel area of a substrate support, the operation comprising:
placing a cover substrate on a substrate support disposed in an interior volume of a processing chamber, the substrate support having a plurality of gas holes disposed through a dielectric body of the substrate support;
providing a first cleaning gas from a first gas source into the interior volume of the processing chamber;
striking a plasma in the interior volume of the processing chamber;
providing a second cleaning gas from a first backside gas supply through an outer ring of a first set of gas holes of the plurality of gas holes disposed in an edge portion of the substrate support to a substrate support bevel edge area defined between an outer diameter of the cover substrate and an edge ring disposed on the substrate support while providing an inert gas from a second backside gas supply through a second set of gas holes of the plurality of gas holes disposed in an inner portion of the substrate support, wherein the inner portion is circumscribed by the edge portion, and wherein the inert gas in the inner portion creates a buffer to prevent the second cleaning gas from the edge portion from entering the inner portion; and
cleaning the substrate support bevel edge area.

7. The non-transitory computer readable storage medium of claim 6, further comprising:
removing the inert gas by vacuum through a hole in the inner portion of the substrate support.

8. The non-transitory computer readable storage medium of claim 6, further comprising:
providing the second cleaning gas through a hole in the edge ring into the bevel edge.

* * * * *